(12) United States Patent
Vijh et al.

(10) Patent No.: US 8,298,339 B2
(45) Date of Patent: Oct. 30, 2012

(54) ROLL-TO-ROLL CONTINUOUS THIN FILM PV MANUFACTURING PROCESS AND EQUIPMENT WITH REAL TIME ONLINE IV MEASUREMENT

(75) Inventors: Aarohi Vijh, Sylvania, OH (US); Xinmin Cao, Sylvania, OH (US); Bradley S. Mohring, Delta, OH (US)

(73) Assignee: Xunlight Corporation, Toledo, OH (US)

( * ) Notice: Subject to any disclaimer, the term of this patent is extended or adjusted under 35 U.S.C. 154(b) by 644 days.

(21) Appl. No.: 12/535,237

(22) Filed: Aug. 4, 2009

(65) Prior Publication Data

US 2010/0029067 A1 Feb. 4, 2010

Related U.S. Application Data

(60) Provisional application No. 61/086,150, filed on Aug. 4, 2008.

(51) Int. Cl.
*C23C 16/00* (2006.01)
(52) U.S. Cl. ........................................ 118/718; 118/719
(58) Field of Classification Search .................. None
See application file for complete search history.

(56) References Cited

U.S. PATENT DOCUMENTS

| | | | | |
|---|---|---|---|---|
| 4,485,125 A * | 11/1984 | Izu et al. | ........................ | 427/74 |
| 5,246,506 A * | 9/1993 | Arya et al. | ..................... | 136/249 |
| 5,514,217 A * | 5/1996 | Niino et al. | ........... | 118/723 MW |
| 5,968,274 A | 10/1999 | Fujioka et al. | | |
| 6,077,722 A * | 6/2000 | Jansen et al. | .................... | 438/74 |
| 6,694,792 B2 * | 2/2004 | Tanaka et al. | ................... | 72/183 |
| 6,811,816 B2 * | 11/2004 | Tamura et al. | ............. | 427/248.1 |
| 8,173,477 B2 * | 5/2012 | Cao et al. | ........................ | 438/61 |
| 2002/0117199 A1 * | 8/2002 | Oswald | ......................... | 136/256 |
| 2009/0223551 A1 * | 9/2009 | Reddy et al. | .................. | 136/244 |
| 2010/0029067 A1 * | 2/2010 | Vijh et al. | ..................... | 438/478 |
| 2011/0189806 A1 * | 8/2011 | Cao et al. | ........................ | 438/62 |

FOREIGN PATENT DOCUMENTS

| | | |
|---|---|---|
| JP | 03-030325 | 2/1991 |
| JP | 04-192415 | 7/1992 |

OTHER PUBLICATIONS

International search report dated Mar. 18, 2010 for PCT Application No. US2009/52720.

* cited by examiner

*Primary Examiner* — David E Graybill
(74) *Attorney, Agent, or Firm* — Wilson Sonsini Goodrich & Rosati

(57) ABSTRACT

Apparatuses and methods are provided for the continuous, roll-to-roll formation of photovoltaic (PV) cells. Apparatuses include reel-to-reel transport chambers, one or more deposition chambers, a differential process isolation unit and a chamber for obtaining real time quality data, including IV data, yield data and uniformity data.

26 Claims, 11 Drawing Sheets

ROLL-TO-ROLL CONTINUOUS THIN FILM PV MANUFACTURING PROCESS AND EQUIPMENT WITH REAL TIME ONLINE IV MEASUREMENT

The application claims the benefit of U.S. Provisional Patent Application No. 61/086,150, filed Aug. 4, 2008, which is entirely incorporated herein by reference.

FIELD OF THE INVENTION

The invention relates to the manufacture and design of equipment for the manufacture of thin-film solar cells. More particularly, the invention relates to apparatuses for continuous manufacture of solar cells incorporating reel-to-reel transport, plasma enhanced chemical vapor deposition processes, sputter deposition processes and an apparatus for obtaining real time performance or quality data, including current-voltage (IV) data, yield data and uniformity data, during the roll-to-roll manufacturing process under vacuum.

BACKGROUND OF THE INVENTION

In prior art manufacturing processes of substrate-type thin-film solar cell materials, a back contact or back reflector layer is deposited, then semiconductor layers are deposited, and then the top contact layer is deposited to complete the basic solar cell or photovoltaic (PV) cell structure. The cell is then tested offline to obtain quality control (QC) measurements. In methods available in the art, these processes are carried out in separate machines, which increases capital cost and reduces throughput due to load/unload times. These times can run into hours for large machines. Also, when separate machines are used, an interleaf material must be inserted between wraps of the semiconductor material as it is wound up before transfer to the top-contact machine. Due to the requirements of cleanliness, vacuum compatibility and temperature resistance, these interleaf materials can be expensive.

Advances in better understanding of hydrogenated amorphous silicon (a-Si:H) materials and devices have led the a-Si:H based solar cell R&D results into large-area a-Si:H based PV module mass production, including substrate-type and superstrate-type processes. A state of art thin-film silicon (tf-Si) based photovoltaic (PV) manufacturing process on stainless steel (SS) web substrate could include a front-end roll-to-roll production line for thin film solar cell material deposition and a back-end production line for PV module assembly. The roll-to-roll method has been described in M. Izu and S. R. Ovshinsky, "Production of Tandem Amorphous Silicon Alloy Cells in a Continuous Roll-To-Roll Process", *SPIE Proc.* 407 (1983) 42, and M. Izu, H. C. Ovshinsky, X. Deng, A. J. Krisko, K. L. Narasimhan, R. Crucet, T. Laarman, A. Myatt, and S. R. Ovshinsky, "Continuous Roll-to-roll Serpentine Deposition for High Throughput a-Si PV Manufacturing", in: *IEEE First World Conference on Photovoltaic Energy Conversion*, (1994) p 820, all of which are entirely incorporated herein by reference.

Prior art roll-to-roll methods typically require the use of several machines, which increases capital cost and reduces production throughput due to load/unload times, process reproducibility, production yield, machine reliability, machine maintainability. In systems employing a single roll-to-roll machine, problems with cross contamination (i.e., gases from one chamber entering and contaminating an adjacent chamber) lead to poor film qualities, leading to increases in manufacturing costs and decreases in efficiency. Accordingly, there is a need in the art for deposition processes that provide high quality thin films while minimizing production costs.

SUMMARY OF THE INVENTION

In an aspect of the invention, a vacuum deposition apparatus comprises a substrate pay-out chamber and a substrate take-up chamber. A substrate support system extends from the substrate pay-out chamber to the substrate take-up chamber. In an embodiment, the vacuum deposition apparatus further comprises a high-pressure vacuum deposition chamber and a low-pressure vacuum deposition chamber. The vacuum deposition apparatus further includes a differential process isolation unit (DPIU) disposed between the high-pressure vacuum deposition chamber and the low-pressure vacuum deposition chamber. In an embodiment, the high-pressure deposition chamber is configured for forming a semiconductor (or semiconductor-containing) thin film. In an embodiment, the low-pressure deposition chamber is configured for forming a transparent conductor thin film, such as an indium tin oxide (ITO) thin film.

In an aspect of the invention, a vacuum deposition apparatus is provided, comprising, a substrate pay-out chamber and a substrate take-up chamber. The apparatus further includes a substrate support system extending from the substrate pay-out chamber to the substrate take-up chamber. In embodiments, the apparatus comprises a semiconductor vacuum deposition chamber, a transparent conductor vacuum deposition chamber, and a differential process isolation unit (DPIU) disposed between the semiconductor vacuum deposition chamber and the transparent conductor vacuum deposition chamber. In embodiments, the DPIU is configured to provide and maintain a pressure differential between the semiconductor vacuum deposition chamber and the transparent conductor vacuum deposition chamber. The DPIU prevents gases from the vacuum deposition chamber from entering the transparent conductor vacuum deposition chamber, and vice versa. In preferable embodiments, the pressure differential between the semiconductor vacuum deposition chamber and the transparent conductor vacuum deposition chamber is greater than or equal to 1:1, greater than or equal to 10:1, or greater than or equal to 100:1, or greater than or equal to 1,000:1, or greater than or equal to 10,000:1.

In another aspect of the invention, a system for forming a thin film over a substrate, comprises a substrate pay-out chamber configured to provide the substrate. The system further comprises a first reaction space configured to form a semiconductor thin film over the substrate and a second reaction space configured to form a transparent conductor over the substrate. The system comprises a DPIU disposed between the first reaction space and the second reaction space, the DPIU configured to prevent one or more gases from the first reaction space from entering the second reaction space. The system further comprises a substrate take-up chamber for collecting the substrate and a substrate support system configured to move the substrate from the substrate pay-out chamber to the first reaction space, from the first reaction space to the second reaction space, and from the second reaction space to the substrate take-up chamber. In embodiments, the DPIU is configured to provide and maintain a pressure differential between the first reaction space and the second reaction space. The DPIU prevents gases from the first reaction space from entering the second reaction space, and vice versa. In preferable embodiments, the pressure differential between the first reaction space and the second reaction space is greater than or equal to 1:1, greater than or equal to 10:1, or greater than or equal to 100:1, or greater than or equal to 1,000:1, or greater than or equal to 10,000:1.

In yet another aspect of the invention, a process isolation unit (PIU) is provided, the PIU comprising a substrate support member, a first port configured to permit movement of the substrate support member into the PIU and a second port configured to permit movement of the substrate support member out of the PIU. The PIU further comprises a first conduction space between the first port and the second port, the first conduction space disposed below a substrate support member. The PIU further comprises a second conduction space between the first port and second port, the second conduction pace above the substrate support member. In embodiments, the PIU comprises a first restrictor disposed between the first conduction space and the first port and a second restrictor disposed between the first conduction space and the second port.

In yet another aspect of the invention, a method for forming a semiconductor thin film is provided, the method comprising moving a substrate from a substrate pay-out chamber to a first chamber. Next, the substrate is moved from the first chamber to a DPIU. Next, the substrate is moved from the DPIU to a second chamber. The substrate is then moved to a substrate take-up chamber. In an embodiment, the DPIU is configured to prevent gas from the first chamber from entering the second chamber, the second chamber disposed between the DPIU and the substrate take-up chamber. In an embodiment, the DPIU maintains a pressure differential (or pressure difference) between the first chamber and the second chamber. In an embodiment, prior to moving the substrate to the substrate take-up chamber, the substrate is moved to an on-line measurement chamber.

In yet another aspect of the invention, a system for forming multiple thin-film layers over a substrate comprises a substrate pay-out chamber configured to provide the substrate. The system further comprises a first reaction space configured to clean the substrate using plasma cleaning process, a second reaction space to form one or more non-semiconductor back-reflector (BR) layers over the cleaned substrate, a third reaction space to form semiconductor thin-film silicon layers over the BR coated substrate, and a fourth reaction space configured to form a non-semiconductor transparent conducting layer over the BR-layer/Si-layer coated substrate. The system further comprises two differential process isolation units. The first differential process isolation unit (DPIU) is disposed between the second reaction space for forming non-semiconductor and the third reaction space for forming semiconductor. In embodiments, the first DPIU is configured to provide and maintain a pressure differential between the second reaction space and the third reaction space, and to prevent one or more gases from the second reaction space from entering the third reaction space, and vice versa. In preferable embodiments, the pressure differential between the second reaction space and the third reaction space is less than or equal to 1:10, or less than or equal to 1:100, or less than or equal to 1:1000, or less than or equal to 1:10,000. A second DPIU disposed between the third reaction space for forming semiconductor and the fourth reaction space for forming semiconductor. In embodiments, the second DPIU is configured to provide and maintain a pressure differential between the third reaction space and the fourth reaction space, and to prevent one or more gases from the third reaction space from entering the fourth reaction space, and vice versa. In preferable embodiments, the pressure differential between the third reaction space and the fourth reaction space is greater than or equal to 10:1, or greater than or equal to 100:1, or greater than or equal to 1000:1, or greater than or equal to 10,000:1. The system further comprises a substrate take-up chamber for collecting the multiple-layer coated substrate and a substrate support system configured to move the substrate from the substrate pay-out chamber to the first reaction space, from the first reaction space to the second reaction space, and then through the first DPIU to the third reaction space, and from the third reaction space through the second DPIU to the fourth reaction space, and from the fourth reaction space to the substrate take-up chamber.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The features and advantages of the invention can be further explained by reference to the following detailed description and accompanying drawings that sets forth illustrative embodiments of the invention.

DETAILED DESCRIPTION OF THE INVENTION

Figure 1:
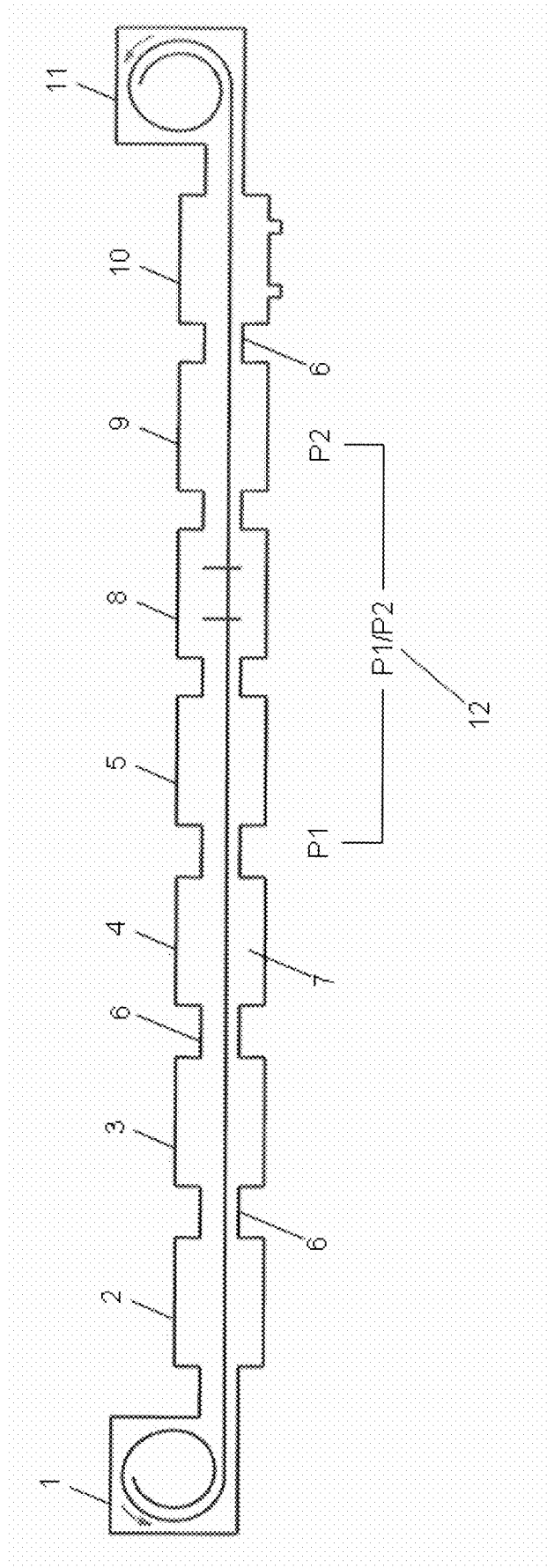
FIG. 1 is a cross-sectional side view of an integrated roll-to-roll manufacturing system with online QC measurement, in accordance with an embodiment of the invention.

Embodiments of the invention provide new roll-to-roll thin film deposition methods and apparatuses for producing large-area semiconductor and non-semiconductor thin films. Various embodiments provide systems and methods that employ a differential pumping assembly, a plasma-enhanced chemical vapor deposition (PECVD) assembly for thin-film silicon based semiconductor layers, such as a-Si, a-SiGe, nc-Si, µc-Si, and poly-Si layers, and a sputtering assembly for depositing a transparent conductive oxide (TCO) non-semiconductor layer, such as an indium tin oxide (ITO) layer, over a substrate. In embodiments, the substrate is provided with the aid of a roll-to-roll machine. In an embodiment, depositing the ITO layer in the same machine as the thin-film silicon based layers also allows direct on-line measurements of the photovoltaic (PV) material as it is being produced. In some embodiments, plasma cleaning chambers and/or back-reflector sputter chambers may also be incorporated.

There are systems available in the art for preventing cross contamination (between vacuum chambers) when adjacent chambers are at similar pressures and using substantially the same gases. Such systems, however, are not capable of preventing cross contamination when adjacent chambers are at different pressures (e.g., a first chamber is at a higher pressure than a second chamber). In various embodiments of the present invention, systems and methods are provided having processes operating at different pressures while advantageously avoiding cross contamination. In some embodiments, cross contamination can be avoided even when different gases (down to 0% commonality in gas composition) are used in the various chambers.

Conventional processes require separate process equipments for tf-Si PECVD processes and ITO sputtering deposition, which requires expensive vacuum pumps, one pair more drive system, more equipment space and time consuming due to a separate PECVD process and sputtering process. The new combination of tf-Si PECVD process and TCO sputtering process into one roll-to-roll machine provided in various embodiments can allow the elimination of interleaf after the PECVD process, thus leading to a reduction in manufacturing cost. This reduction in material cost and the increase in throughput can significantly reduce overall cost of manufacture by themselves. One take-up and pay-out system is eliminated and yield is expected to be higher because intermediate wind-up is not required (winding can cause yield problems due to micro-scratches). Labor costs are lowered because one machine operator is needed instead of two, and the transfer process is eliminated. Additionally, in-process inventory will be reduced.

In embodiments of the invention, fast quality assurance (QA) or quality control (QC) is made possible by direct real-time online (also "online" herein) measurement of a completed cell structure, which can include an ITO top-contact (or top-contactor) layer. In an embodiment of the invention, rapid QA/QC is made possible by forming a-Si and ITO in the same machine or apparatus, wherein the apparatus comprises a DPIU.

Roll-to-roll manufacturing apparatuses, systems and processes of embodiments of the invention include a series of deposition processes in vacuum and an online QC process. An apparatus of an embodiment of the invention comprises roll-to-roll manufacturing equipment incorporating six main parts: a transport system comprising payout, takeup and guiding components; a vacuum vessel or vessels; a plasma-enhanced chemical vapor deposition (PECVD) deposition zone or reaction space for the semiconductor; a differential process isolation system; a sputter deposition zone for the top-contact; and an integrated measurement system, which can be located at a point between the top-contact sputter deposition and the take-up reel. The apparatus can also include one or more zones (or chambers) configured for physical vapor deposition, atomic layer deposition and hot-wire chemical vapor deposition. In some embodiments of the invention, the apparatus can include one or more zones configured for a hybrid CVD process combining PECVD and hot-wire CVD, as described in U.S. patent application Ser. No. 12/168,833, filed on Jul. 7, 2008, which is entirely incorporated herein by reference. This system allows fabrication of semiconductor and top contact layers in a single pass and provides on-line quality control data.

In embodiments of the invention, roll-to-roll vacuum deposition apparatuses or systems comprises a pay-out chamber; a take-up chamber; a substrate support system; at least one semiconductor vacuum deposition chamber; at least one transparent conductor vacuum deposition chamber; at least one DPIU located between deposition chambers; and at least one real-time online performance measurement chamber. In an embodiment of the invention, the at least one semiconductor vacuum deposition chamber is configured to deposit thin-film silicon or thin-film silicon alloys. In another embodiment of the invention, the at least one transparent conductor vacuum deposition chamber is configured to deposit indium-tin oxide (ITO). In yet another embodiment of the invention, the at least one transparent conductor vacuum deposition chamber is configured to deposit any transparent conductive (or conducting) oxide (TCO). In yet another embodiment of the invention, the real-time online measurement system can be located between the transparent conductor deposition chamber and the take-up chamber. In still another embodiment of the invention, the real-time online measurement system can comprise a current-voltage (IV) measurement system. In still another embodiment of the invention, the real-time online measurement system can comprise a cell isolation system. The cell isolation system can comprise a laser scriber.

In other embodiments of the invention, roll-to-roll vacuum deposition apparatuses or systems comprise a pay-out chamber; a take-up chamber; a substrate support system; at least one semiconductor vacuum deposition chamber; at least one transparent conductor vacuum deposition chamber; and at least one DPIU located between deposition chambers. Roll-to-roll vacuum deposition apparatuses of embodiments of the invention can be configured to deposit thin film silicon or thin film silicon alloys, in addition to indium-tin oxide. In an embodiment of the invention, the at least one semiconductor vacuum deposition chamber is configured to deposit thin film silicon or thin film silicon alloys. In another embodiment of the invention, the at least one transparent conductor vacuum deposition chamber is configured to deposit indium-tin oxide (ITO). In yet another embodiment of the invention, the at least one transparent conductor vacuum deposition chamber is configured to deposit any transparent conductive (or conducting) oxide (TCO).

In embodiments of the invention, the roll-to-roll vacuum deposition apparatus comprises a computer system configured to control the formation of solar cells. The computer system can collect QA/QC data during online QA/QC measurements. The computer system can also control the rate at which films are deposited over a substrate during solar cell formation. Accordingly, the computer system can control chamber pressures, flow rates of one or more reactants into vacuum chambers during deposition, and the rate at which a substrate is moved through a vacuum chamber during thin film deposition.

In embodiments of the invention, an a-Si layer can be formed at a pressure greater than about 0.05 Torr, or greater than about 0.1 Torr, or greater than about 0.5 Torr, and an ITO layer can be formed at a pressure below about 0.1 Torr, or below about 0.05 Torr, or below about 0.005 Torr. In an embodiment, the ITO layer can be formed at a pressure less than or equal to about 0.001 Torr.

In an aspect of the invention, a vacuum deposition apparatus comprises a substrate pay-out chamber and a substrate take-up chamber. The vacuum deposition apparatus further comprises a substrate support system extending from the substrate pay-out chamber to the substrate take-up chamber. For example, the substrate support system could incorporate the magnetic roller that is the subject of U.S. Provisional Patent Application Ser. No. 61/212,614, filed on Jun. 3, 2009, which is hereby incorporated by reference in its entirety. The vacuum deposition apparatus also comprises a first vacuum deposition chamber and a second vacuum deposition chamber.

In an embodiment, the first vacuum deposition chamber (also "reaction chamber" herein) is a high-pressure vacuum deposition chamber and the second vacuum deposition chamber is a low-pressure vacuum deposition chamber. In an embodiment, the pressure in the high-pressure vacuum deposition chamber is greater than the pressure in the low-pressure vacuum deposition chamber. In one example, a high-pressure vacuum deposition chamber may have a pressure within the range of 0.1 to 20 Torr, and a low-pressure vacuum deposition chamber may have a pressure within the range of 0.0001 to 2 Torr. The vacuum deposition apparatus further comprises a differential process isolation unit ("DPIU"). In an embodiment, the DPIU is disposed between the high-pressure vacuum deposition chamber and the low-pressure vacuum deposition chamber. In an embodiment, the DPIU is configured to maintain a pressure differential between the high pressure vacuum deposition chamber and the low-pressure vacuum deposition chamber. In embodiments, with P1 designating the pressure in the high-pressure vacuum deposition chamber and P2 designating the pressure in the low-pressure vacuum deposition chamber, the DPIU is configured to maintain a pressure differential, P1/P2, greater than or equal to about 1:1, greater than or equal to about 10:1, or greater than or equal to about 100:1, or greater than or equal to about 1,000:1, or greater than or equal to about 10:000:1.

In an embodiment, the first vacuum deposition chamber is configured to form one of a p-doped or n-doped semiconductor thin film over the substrate. In an embodiment, the vacuum deposition apparatus includes a third vapor deposition chamber between the first vapor deposition chamber and the DPIU. The third vapor deposition chamber is configured to form an intrinsic semiconductor thin film over the substrate. In an embodiment, the vacuum deposition apparatus further includes a fourth vapor deposition chamber between the third vapor deposition chamber and the DPIU, the fourth vapor deposition chamber configured to form the other of the p-doped or n-doped semiconductor thin film over the substrate. In an embodiment, the first vapor deposition chamber is configured to form an n-doped (n-type semiconductor) semiconductor thin film, the third vapor deposition chamber is configured to form an intrinsic semiconductor thin film, and the fourth vapor deposition chamber is configured to form a p-doped semiconductor thin film. In another embodiment, the first vapor deposition chamber is configured to form a p-doped (p-type semiconductor) semiconductor thin film, the third vapor deposition chamber is configured to form an intrinsic semiconductor thin film, and the fourth vapor deposition chamber is configured to form an n-doped semiconductor thin film.

"Reaction space" is used to designate a reactor, reaction chamber, vacuum deposition chamber, vacuum deposition reactor, or an arbitrarily defined volume in which conditions can be adjusted to effect thin film growth over a substrate by various vacuum deposition methods, such as, e.g., chemical vapor deposition (CVD), atomic layer deposition (ALD), physical vapor deposition (PVD), sputtering and evaporation, including plasma-enhanced variations of the aforementioned methods. The reaction space can include surfaces subject to all reaction gas pulses from which vapor phases chemicals (or gases) or particles can flow to the substrate, by entrained flow or diffusion, during normal operation. The reaction space can be, for example, a plasma-enhanced CVD (PECVD) reaction chamber in a roll-to-roll system of embodiments of the invention. As another example, the reaction space can be a vacuum deposition chamber configured for forming a transparent conductor thin film over a substrate, such as an ITO thin film (or layer).

Reference will now be made to the figures, wherein like numerals refer to like parts throughout. It will be appreciated that the figures are not necessarily drawn to scale.

With reference to FIG. 1, an integrated roll-to-roll manufacturing system or apparatus with online QC measurement is shown, in accordance with an embodiment of the invention. A coil of substrate material is loaded into payout chamber 1 and guided through a pre-treatment chamber 2, an n-doped deposition chamber 3, an intrinsic deposition chamber 4, a p-doped deposition chamber 5. Each deposition chamber may be connected to the adjacent chamber by bridge chambers 6, the bridge chambers 6 constructed to allow free passage of a substrate web (also "web" herein) 7 while blocking substantially the flow of dopant materials from one deposition chamber (or reaction space) to the adjacent deposition chamber. Further, the substrate web is guided through a DPIU 8, the DPIU 8 being constructed to allow free movement of the web while blocking flow of gas across it to an extent that a pressure differential (or pressure difference) 12 is created and maintained and preventing any cross-contamination from one port to the other. The web 7 is further guided through a top-contact deposition chamber 9 and a bridge chamber 6 into an online measurement chamber 10, and finally into take-up chamber 11, where it is wound up. In embodiments of the invention, the pressure differential 12 is such that P1 is greater than P2, and the ratio P1/P2 is greater than or equal to about 10, or greater than or equal to about 100, or greater than or equal to about 1,000, or greater than or equal to about 10,000. In other embodiments, the pressure differential 12 is such that P1 is less than P2, and the ratio P2/P1 is greater than or equal to about 10, or greater than or equal to about 100, or greater than or equal to about 1,000, or greater than or equal to about 10,000. In an embodiment, the pressure differential 12 is maintained while a substrate is being transported or moved through the deposition chambers and the online measurement chamber.

Many variations of the apparatus of FIG. 1 are possible. For example, the number of deposition chambers could be increased or decreased (e.g., the system of FIG. 1 could have 1, 2, or 3 chambers or reaction spaces). As another example, a second sputter zone and corresponding DPIU could be incorporated before the semiconductor deposition zone to allow fabrication of back-reflectors. As another example, a plasma cleaning chamber could be incorporated before the semiconductor deposition zone or before the back-reflector sputter zone, along with corresponding DPIUs as required. As yet another example, the DPIU (also "process DPIU" herein) could be designed with wrap angles of zero degrees, or 90 degrees or 180 degrees, or indeed any value practical to the layout of the machine. As still another example, the online measurement chamber 10 and take-up chamber 11 could be combined into a single chamber.

With continued reference to FIG. 1, in an embodiment, the apparatus can further include a back-reflector deposition chamber (not shown) for forming a back reflector. The back reflector deposition chamber can be disposed prior to any vacuum deposition chambers (e.g., between the substrate pay-out chamber and the pre-treatment chamber 2). In an embodiment, the pre-treatment chamber 2 can be configured for plasma cleaning a substrate prior to thin film deposition. In such a case, the pre-treatment chamber 2 can be referred to as a plasma cleaning chamber. Plasma cleaning can be performed via ion sputtering (e.g., Ar ion sputtering).

Figure 2:
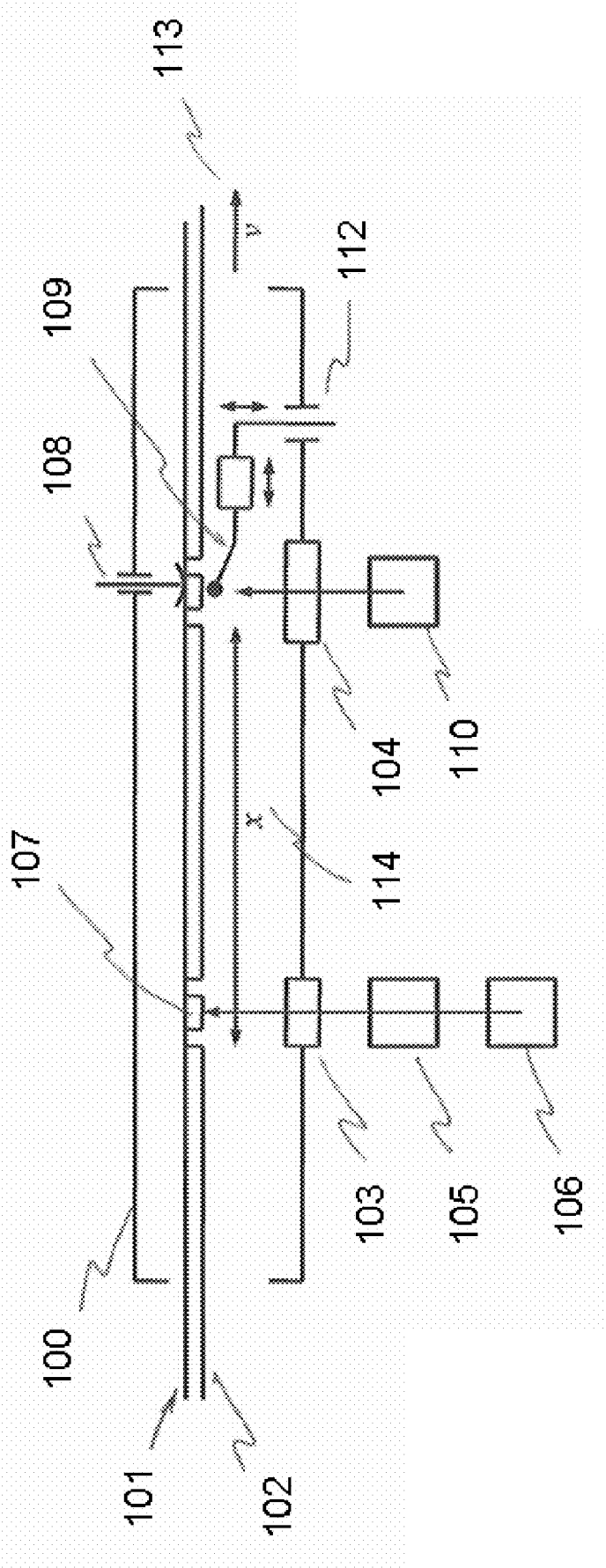
FIG. 2 is a cross-sectional side view of an online measurement chamber, in accordance with an embodiment of the invention.

FIG. 2 shows an online performance measurement chamber 100, in accordance with an embodiment of the invention.

With reference to FIG. 2, a laser scribing system comprising source 106 and optics 105 is mounted near the first window 103 such that the optics have an unobstructed view of the coated substrate web 101 as it moves past the window with velocity v (113). In an embodiment, the laser scribing system is capable of scribing away the TCO layer 102, thereby isolating a portion 107 of the cell-web. In an embodiment, the scribing system (or optics) can be constructed to allow isolation of a small portion at any location across the width of the web, for example by mounting it on a linear translation stage parallel to the first window. In an embodiment, the scribing system can be used to create multiple small cells across the width of the web as it moves past the first window.

With continued reference to FIG. 2, a light source 110 can be provided outside the chamber, positioned such that it illuminates the isolated small cells as they move past the second window 104. When a small cell is illuminated, a moveable (or retractable) electrical probe 109 inside the vacuum vessel can be brought in contact with the cell and an IV (i.e., current-voltage) measurement can be taken. In an embodiment, the location x (114) of the measurement probe and the velocity v (113) of the web can be used to determine the time of measurement. Alternatively, the location of the cell to be measured can be determined by an optical inspection system. In an embodiment, a measurement can be taken with an electrical or electrostatic probe in contact with (or in sufficiently close proximity to) the isolated cells. In an embodiment, the construction of the probe is selected so as not to substantially damage the small cell during measurement. In an embodiment, the probe assembly can be moved across the web to measure isolated small cells that are located at different positions across the width of the web as the web is moving. The probe assembly can be housed in the chamber, or can be manipulated through feedthrough 112.

Many variations of the apparatus of FIG. 2 are possible. For example, the moveable probe assembly could be replaced with multiple probes. As another example, the moveable laser scriber could be replaced with multiple scribers. As yet another example, the first and second windows could be replaced with a single window large enough to accommodate both the laser scribe beam and the measurement illumination beam. As still another example, the light sources could be located within the vacuum vessel. This could eliminate the need for a window. As still another example, the laser scribing system, or a portion thereof, could be located within the vacuum vessel. This could eliminate the need for a window or allow the use of a smaller window.

Figure 3:
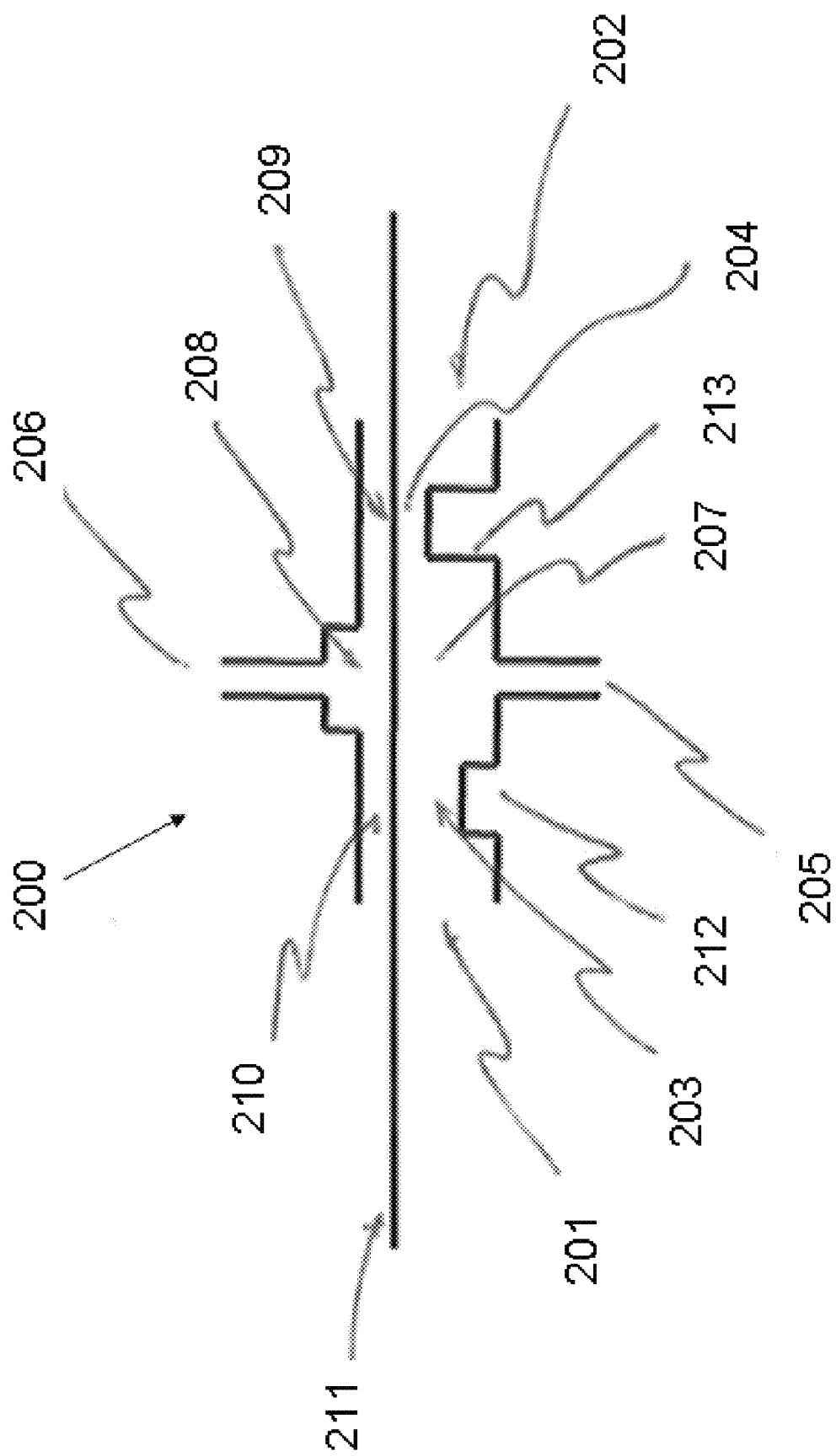
FIG. 3 is a cross-sectional aide view of a process isolation unit (PIU), in accordance with an embodiment of the invention.

FIG. 3 shows a process isolation unit (PIU) 200 that is capable of maintaining a pressure differential across its two ports while allowing substantially no flow of gas from the first port to the second port, and vice-versa. In an embodiment, the PIU of FIG. 3 can be disposed in an PIU located between a first reaction space (or chamber) and a second reaction space, the PIU configured to prevent the flow of gas from the first reaction chamber into the second reaction chamber while permitting the movement of a substrate from the first reaction chamber to the second reaction chamber.

With reference to FIG. 3, the process isolation unit 200 comprises a first port (or inlet) 201 and a second port 202, each individually constructed to allow free movement of gas and substrate a substrate support member 211 having a substrate. In an embodiment, the substrate support member 211 is a substrate web. The first port 201 and second port 202 are configured to permit the movement of the substrate support member 211 into and out of the PIU 200. In an embodiment, the first port 201 is configured to permit movement of the substrate support member 211 into the isolation unit 200 and the second port 202 is configured to permit movement of the substrate support member 211 out of the PIU 200. In an alternative embodiment, the first port 201 is configured to permit movement of the substrate support member 211 out of the PIU 200 and the second port 202 is configured to permit movement of the substrate support member 211 into the PIU 200.

With continued reference to FIG. 3, the PIU 200 further comprises a first conduction space 207 and a second conduction space 208 between the first port 201 and the second port 202. In the illustrated embodiment, the first conduction space 207 is disposed below the substrate support member 211 and the second conduction space 208 is disposed above the substrate support member 211. One or more gases (also "vapor phase chemicals" herein) can be admitted into the first conduction space 207 through a first sweep gas inlet (or inlet port) 205. Gas can be admitted into the second conduction space 208 through a second sweep gas inlet 206. The first and second sweep gas inlets 205, 206 can be configured to admit any sweep gas, such as, e.g., one or more of $H_2$, $N_2$, He, Ne and Ar.

In accordance with some embodiments of the invention, a sweep gas inlet (e.g., 205, 206) may have a desired cross sectional area or shape. In some embodiments, multiple sweep gas inlets may be provided. The sweet gas inlets may have the same cross sectional area and/or shape, or the cross sectional area and/or shape of the sweet gas inlets may vary. In some instances, the cross sectional areas of one or more sweep gas inlets 205, 206 may be smaller than the cross sectional areas of a first conductance space 207 a second conductance space 208, a third conductance space 210, a fourth conductance space 209, a first conductance 203, and/or a second conductance 204. Alternatively, the cross sectional areas of one or more sweep gas inlets 205, 206 may be greater than the cross sectional areas of a third conductance space 210, a fourth conductance space 209, a first conductance 203, and/or a second conductance 204.

With continued reference to FIG. 3, in certain embodiments, the conduction spaces are in fluid communication with each other. In some embodiments, the conduction spaces 207 and 208 are combined into a single space, the single space being in fluid communication with a single sweep gas inlet port. A first restrictor (or gas restrictor) 212 is disposed between the first conduction space 207 and the first port 201, positioned to provide a first conductance 203. Located between the first conduction space 207 and second port 202 is a second restrictor 213, positioned to provide a second conductance 204. In an embodiment, on the side of the substrate away from the restrictors is a third conduction space 210 connecting the first port 201 to the second conduction space 208. On the side of the substrate away from the restrictors, there is a fourth conduction space 209 connecting the second port 202 to the second conduction space 208. In a preferable embodiment, the spaces 209 and 210 can have substantially smaller conductances than either of the conductances 203 and 204.

In some embodiments, the first conductance 203 can be substantially different in magnitude than the second conductance 204. In an embodiment, the first conductance 203 is larger than the second conductance 204. In another embodiment, the first conductance 203 is smaller than the second conductance 204. In certain embodiments, the geometry of the restrictors 212 and 213 can be changed to effect a change in the conductances 203 and 204. In an embodiment, the geometry of the restrictors 212 and 213 is selected so as to provide conductances 203 and 204 that effect a pressure drop across the restrictors 212 and 213 as desired. In an embodiment, the first and second restrictors 212, 213 can be walls disposed within the PIU 200.

In other words, the first and second restrictors can be selected such that the first conductance 203 and the second conductance 204 may have a desired cross sectional area. For example, the first conductance may have a greater cross sectional area than the second conductance or vice versa. For example, the cross sectional areas of the first conductance and second conductance may vary such that the ratio of their areas may be on the order of about 100:1, 50:1, 20:1, 10:1, 5:1, 3:1, 2:1, 1:1, or the other way around. The first and second restrictions may also be selected so the first conductance and the second conductance may have a desired cross-sectional shape. For example, the first and second conductance may form a circle, square, rectangle, trapezoid, triangle, hexagon, octagon, or any other geometric shape.

Figure 4:
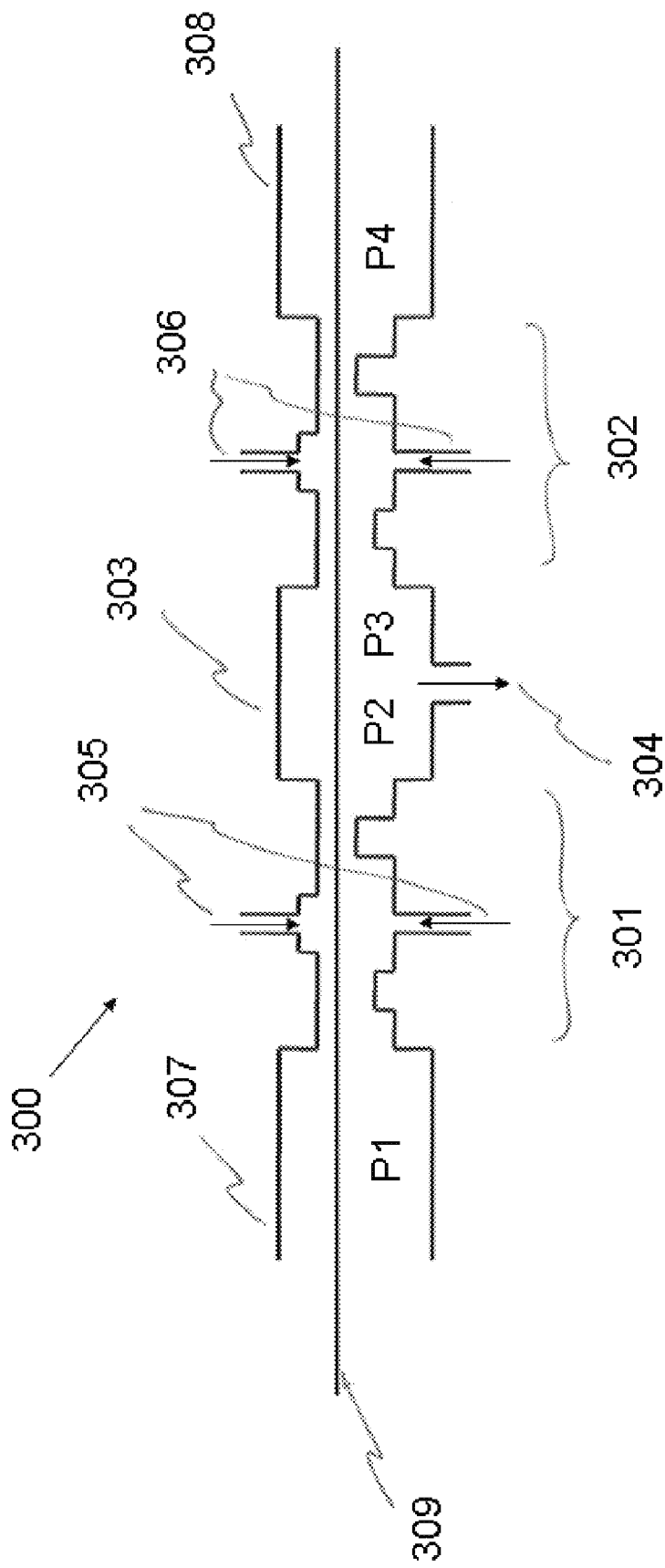
FIG. 4 is a cross-sectional side view of a differential process isolation unit (DPIU) system, in accordance with an embodiment of the invention.

With reference to FIG. 4, a DPIU (also "isolation system" herein) 300 capable of maintaining a pressure differential between two deposition spaces (or reaction spaces) is shown, allowing substantially no cross contamination of gases between the two deposition spaces (or chambers), while allowing free movement of a substrate web (or substrate support member). In embodiments, the DPIU 300 is configured to maintain a pressure differential greater than or equal to about 10:1, or greater than or equal to about 100:1, or greater than or equal to about 1000:1, or greater than or equal to about 10,000:1. In an embodiment, the differential process isolation unit (DPIU) 300 of FIG. 4 can include the PIU 200 of FIG. 3. In some cases, the DPIU can include multiple PIUs.

With continued reference to FIG. 4, the DPIU 300 comprises an evacuation space 303 in fluid communication with a first PIU 301 and a second PIU 302. One port of the first PIU 301 is connected to a first deposition space 307 while a second port of the first PIU 301 is connected to the evacuation space 303. One port of the second PIU 302 is connected to a second deposition space 308 and a second port of the second PIU 302 is connected to the evacuation space 303. In an embodiment, the pressure in the first deposition space 307 is greater than the pressure in the second deposition space 308.

With continued reference to FIG. 4, the pressure in the first deposition space 307 proximate the first PIU 301 is 'P1'. The pressure in the second deposition space 308 proximate the second PIU 302 is 'P4'. The pressure in the evacuation space 303 proximate the first PIU 301 is 'P2'. The pressure in the evacuation space 303 proximate the second PIU 302 is 'P3'. Sweep gas is admitted into the first PIU 301 via first sweep gas inlet ports 305. Sweep gas is admitted into the second PIU 302 via second sweep gas inlet ports 306. A substrate 309 can move freely from the first deposition space 307 to the second deposition space 308, and vice versa.

In embodiments, the DPIU is configured to maintain a pressure differential between the first and second deposition spaces in excess of about 1:10, or in excess of about 1:100, or in excess of about 1:1000, or in excess of about 1:10,000. In one embodiment, the ratio between P1 and P4 (i.e., P1/P4) is greater than equal to about 10 (i.e., 10:1), or greater than equal to about 100 (i.e., 100:1), or greater than equal to about 1,000 (i.e., 1,000:1), or greater than or equal to about 10,000 (i.e., 10,000:1). In another embodiment, the ratio between P4 and P1 (i.e., P4/P1) is greater than or equal to about 10, or greater than or equal to about 100, or greater than or equal to about 1,000, or greater than or equal to about 10,000. In a preferable embodiment, the pressure differential is maintained while the substrate 309 is moved (or directed) through the first deposition space 307 and the second deposition space 308. The substrate 309 can be moved through the deposition spaces with the aid of a substrate support member, such as a substrate support roller.

Figure 5:
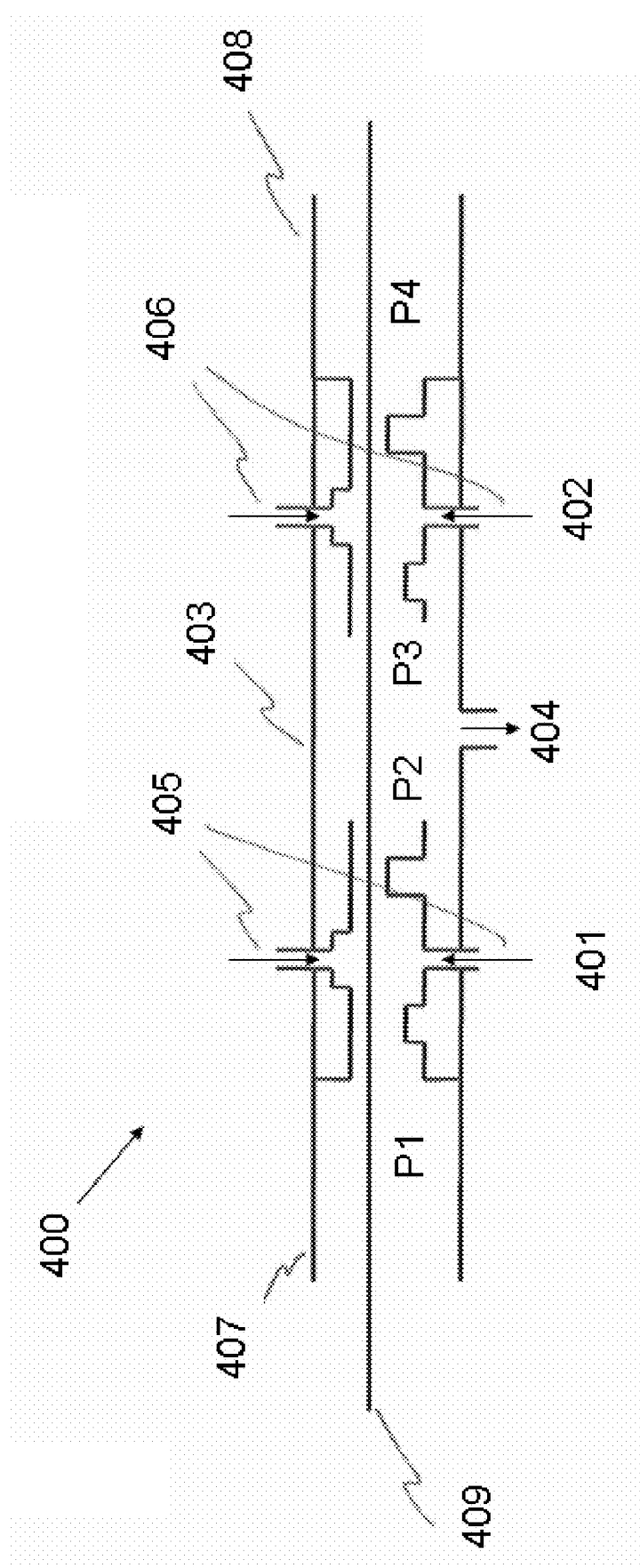
FIG. 5 is a cross-sectional side view of a differential process isolation unit (DPIU), in accordance with an embodiment of the invention.

FIG. 5 illustrates a DPIU 400 configured to maintain a pressure differential between a plurality of deposition spaces, allowing substantially no cross contamination of gases between the plurality of deposition spaces, while allowing free movement of a substrate support member (e.g., substrate web). In an embodiment, the DPIU 400 is a differential pumping chamber that is in fluid communication with a vacuum system. In such a case, the DPIU 400 can be described as a DPIU (or differential process isolation unit). In an embodiment, the DPIU 400 is configured to maintain a pressure differential between two deposition spaces. In embodiments, the DPIU 400 is configured to maintain a pressure differential (or difference) greater than or equal to about 10:1, or greater than or equal to about 100:1, greater than or equal to about 1000:1, or greater than or equal to about 10,000:1. In embodiments, the DPIU 400 is configured to maintain a first pressure on one side of the DPIU 400 and a second pressure on the other side of the DPIU 400, wherein the first pressure is between about 0.1 Torr and 20 Torr, and wherein the second pressure is less than or equal to about 0.01 Torr, or less than or equal to about 0.001 Torr.

With continued reference to FIG. 5, the DPIU 400 comprises an evacuation space 403 in fluid communication with a first PIU 401 and a second PIU 402. One port of the first PIU 401 is connected to (or adjacent) a first deposition space 407 while a second port of PIU 401 is connected to the evacuation space 403. One port of the second PIU 402 is connected to a second deposition space 408 and a second port of PIU 402 is connected to the evacuation space 403. The pressure in the first deposition space 407 proximate the first PIU 401 is 'P1'. The pressure in the second deposition space 408 proximate the second PIU 402 is 'P4'. The pressure in the evacuation space 403 proximate the first PIU 401 is 'P2'. The pressure in the evacuation space 403 proximate the second PIU 402 is 'P3'. A first sweep gas can be provided into the first PIU 401 via inlet ports 405. A second sweep gas can be admitted into the second PIU 402 via inlet ports 406. The first and second sweep gases are removed from the evacuation space via exhaust (or outlet) port 404. In an embodiment, gas is exhausted from the evacuation space 403 with the aid of a vacuum pumping system having, e.g., a mechanical pump or a turbomolecular ("turbo") pump. In an embodiment, the first sweep gas is hydrogen ($H_2$) or helium (He), or a mixture having $H_2$ or He, and the second sweep gas is argon (Ar), neon (Ne) or He, or a mixture containing Ar, Ne, or He. In preferable embodiments, the first sweep gas is chosen to be benign to the process in first deposition space 407 (i.e., the first sweep gas is substantially nonreactive with one or more vapors or gases in the first deposition space 407), and the second sweep gas is chosen to be benign to the process in the second deposition space 408 (i.e., the second sweep gas is substantially nonreactive with one or more gases in the second deposition space 408). In an embodiment, the first sweep gas and second sweep gas are the same gas.

While the DPIU 400 includes two inlet ports 405 and two inlet ports 406, it will be appreciated that the system 400 can include any number of inlet ports. For example, the system can include one inlet port 405 and two inlet ports 406. As another example, the system can include 2 inlet ports 405 and three inlet ports 406. The inlet ports can be distributed and sized as desired to provide a pressure differential of embodiments of the invention.

In an embodiment, the DPIU 400 is configured to maintain P1 between about 0.1 Torr and about 20 Torr, and P4 less than or equal to about 0.1 Torr, or less than or equal to about 0.01 Torr. In another embodiment, the DPIU 400 is configured to maintain P4 between about 0.1 Torr and about 20 Torr, and P1 less than or equal to about 0.01 Torr, or less than or equal to about 0.001 Torr. In embodiments, the DPIU 400 maintains P1 and P4 at certain levels while a substrate is directed through the first deposition space 407 and the second deposition space 408.

In embodiments, the first deposition chamber 407 is configured to deposit a semiconductor-containing material over a substrate and the second deposition chamber 408 is configure to form a transparent conductor layer (i.e., the second deposition chamber 408 is a transparent conductor deposition chamber) over the substrate. In an embodiment, P1 is greater than P4, or substantially greater than P4.

In embodiments, the first deposition space 407 is configured for vapor phase deposition. In an embodiment, the first deposition space 407 is configured for chemical vapor deposition (CVD). In another embodiment, the first deposition space 407 is configured for atomic layer deposition (ALD). In an embodiment, the first deposition space 407 can be configured for plasma-enhanced CVD or ALD. In embodiments, the second deposition space 408 is configured for forming a transparent conductor over a substrate. In an embodiment, the second deposition space 408 is configured for ion sputtering. In another embodiment, the second deposition space 408 is configured for physical vapor deposition. In an embodiment, the second deposition 408 is configured for deposition an indium tin oxide thin film over a substrate.

In embodiments, a substrate can move freely from the first deposition space 407 to the second deposition space 408, and vice versa. The substrate can be provided with the aid of a substrate support member 409. The substrate support member 409 can be part of a roll-to-roll deposition system (see FIG. 1). In an embodiment, the substrate support member 409 can be a substrate web.

Example 1

Figure 6:
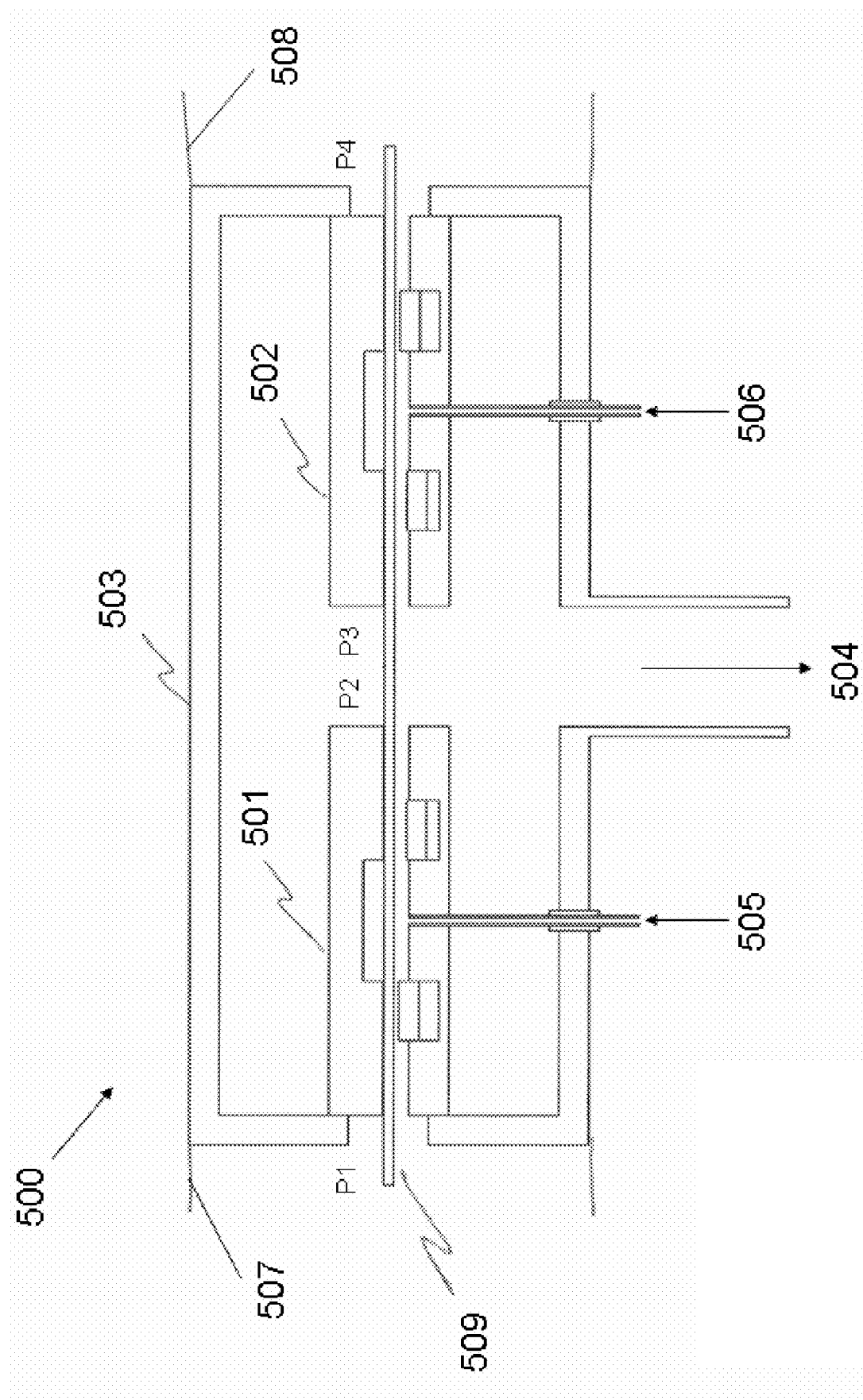
FIG. 6 is a cross-sectional side view of a differential process isolation unit (DPIU), in accordance with an embodiment of the invention.

FIG. 6 illustrates a DPIU 500 comprising an evacuation space 503 in fluid communication with a first PIU 501 and a second PIU 502. One port of the first PIU 501 is connected to a first deposition space 507 while a second port of PIU 501 is connected to the evacuation space 503. One port of the second PIU 502 is connected to a second deposition space 508 and a second port of PIU 502 is connected to the evacuation space 503. The pressure in the first deposition space 507 proximate the first PIU 501 is 'P1'. The pressure in the second deposition space 508 proximate the second PIU 502 is 'P4'. The pressure in the evacuation space 403 proximate the first PIU 501 is 'P2'. The pressure in the evacuation space 403 proximate the second PIU 502 is 'P3'. A first sweep gas (e.g., $H_2$) is provided into the first PIU 501 via inlet port 505. A second sweep gas (e.g., Ar) is admitted into the second PIU 502 via inlet port 506. The first and second sweep gases are removed from the evacuation space 503 via exhaust (or outlet) port 504. Gas can be exhausted from the evacuation space 503 with the aid of a vacuum pumping system having, e.g., a mechanical pump or a turbomolecular ("turbo") pump.

Example 2

Figure 7:
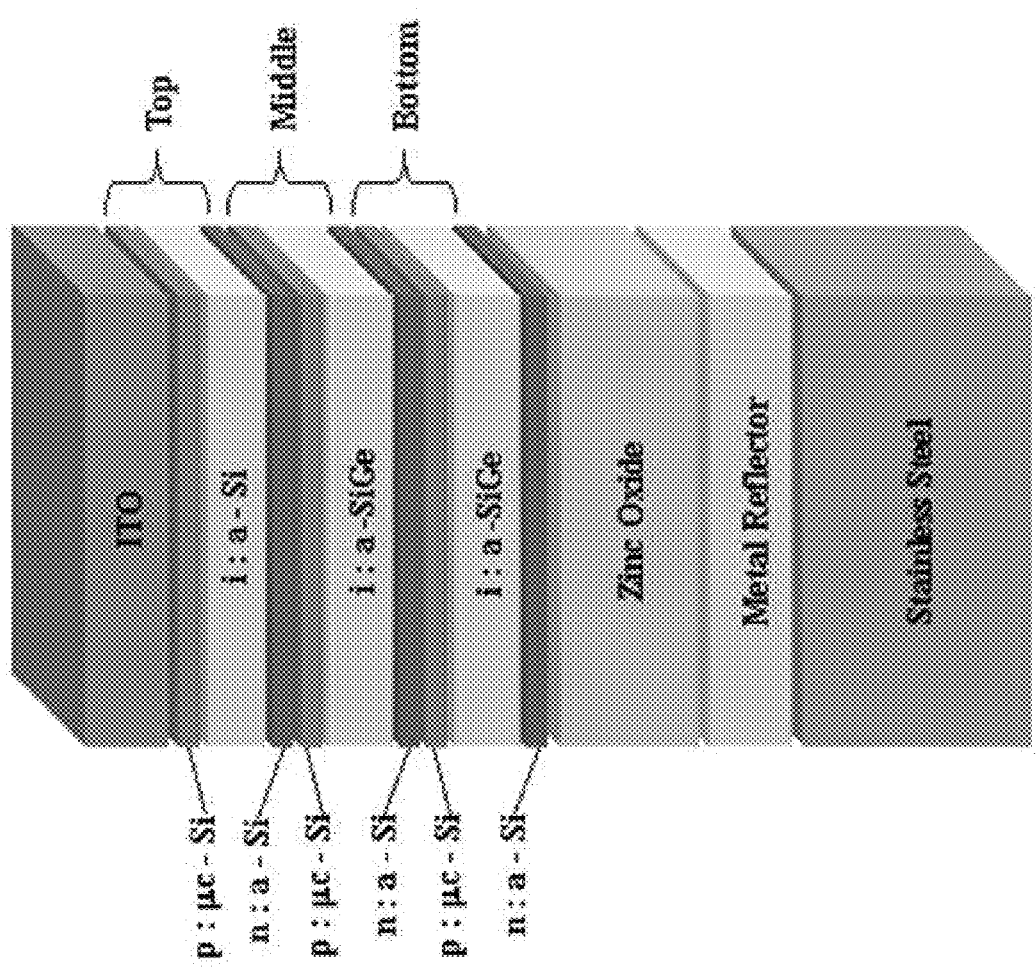
FIG. 7 illustrates a photovoltaic (or solar cell) device formed using a plurality of roll-to-roll production systems, in accordance with an embodiment of the invention.
Figure 8:
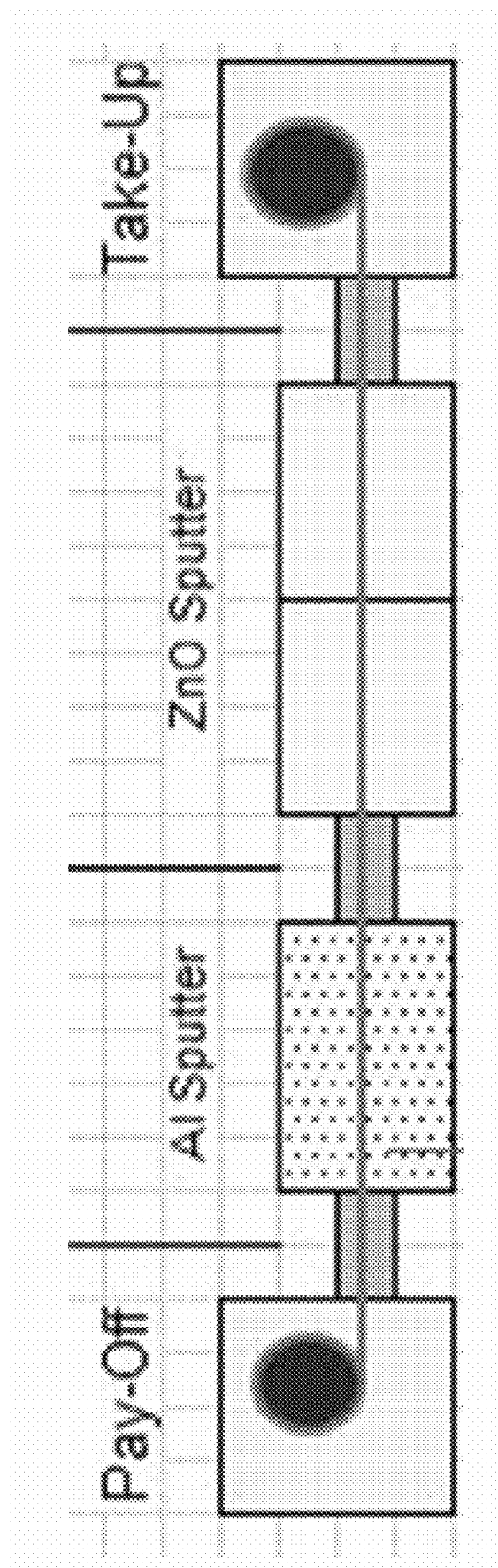
FIG. 8 is a cross-sectional side view of a back reflector roll-to-roll production machine, in accordance with an embodiment of the invention.
Figure 9:
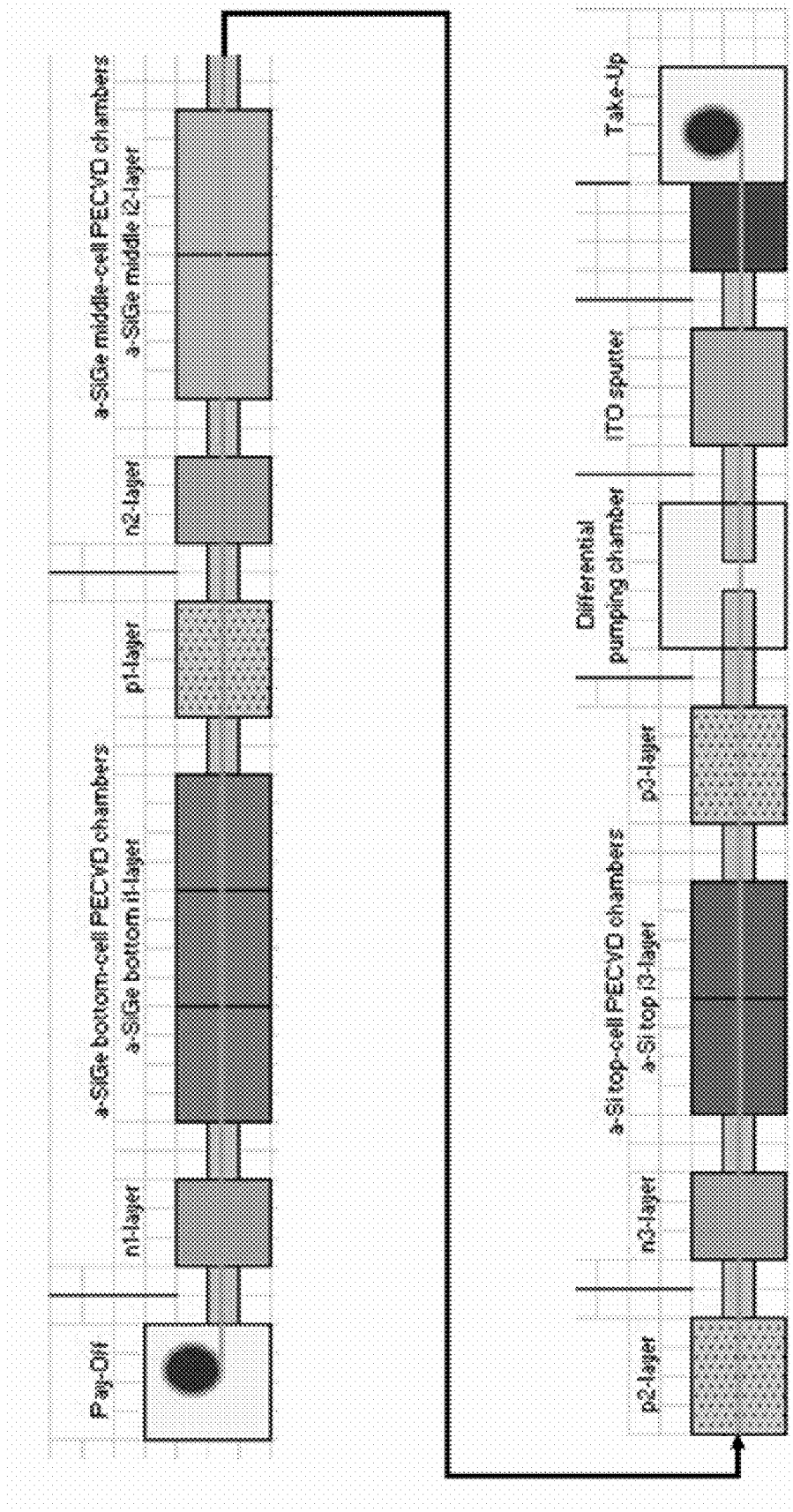
FIG. 9 is a cross-sectional side view of a silicon-PECVD/ITO-sputter roll-to-roll production machine (illustrated in two sections, top and bottom, joined by a connector line in order to fit on page), in accordance with an embodiment of the invention.

A plurality or roll-to-roll deposition systems may be used to form the photovoltaic cell of FIG. 7. A large-scale thin-film silicon solar cell production line in the front-end facility comprises one roll-to-roll washing machine (not shown), one back reflector roll-to-roll production machine (FIG. 8) and one PECVD/ITO roll-to-roll production machine (FIG. 9). Stainless steel (SS) coils are used as substrates, which in some embodiments may have a thickness of 0.005" (0.127 mm), a minimum width of 10", a preferable width of 36", and a minimum length of 5000 ft.

In the roll-to-roll washing machine, a roll of an uncleaned SS web substrate loaded at pay-off (wind-off) chamber is guided in a roll-to-roll wet chemical cleaning process through a detergent tank, a DI water rinse tank, a blower and dry station. An oil-free, particle-free, clean SS substrate web is then wound up together with protective interleaf onto a core at the take-up (wind-up) chamber of the washing machine.

Next, a back-reflector is deposited on the substrates. For back-reflector deposition, a stainless steel coil of cleaned 3 ft-wide SS substrate web may be loaded into a large-scale back reflector roll-to-roll production machine (see FIG. 8) and put through the following processes: the cleaned SS web will move into metal (Al or Ag) sputtering chamber and ZnO sputtering chambers for depositing a metal reflective layer (with a minimum thickness of 100 nm) and a ZnO barrier layer (with a minimum thickness of 300 nm) respectively. The flexible SS web coils coated with Al (or Ag)/ZnO back-reflector at BR machine will be transferred to PECVD/ITO machine to serve as substrates for thin-film silicon and ITO materials deposition.

Next, the photovoltaic device structure is deposited. During thin-film silicon and ITO deposition, the BR coated SS coils are loaded into a large-scale PECVD/ITO roll-to-roll production machine, as shown in FIG. 9. The roll-to-roll production machine of FIG. 9, illustrated in two sections to fit on the page, may be a single, continuous roll-to-roll system. A substrate web will move at 4 feet (ft)/min through all thin-film silicon PECVD chambers to be deposited with ~600 nanometers (nm) 9-layer films (n1/i1/p1/n2/i2/p2/n3/i3/p3, wherein 'n', 'p' and 'i' designate n-type, p-type and intrinsic films or thin films, respectively) of an advanced a-Si/a-SiGe/a-SiGe structure. Then the thin-film silicon coated material web will move through a differential chamber and an ITO sputtering chamber for completing ~70 nm transparent conductive ITO deposition on the top. Thus large-area (minimum 3 feet×5000 feet) flexible thin-film silicon photovoltaic (or solar cell) materials can be produced in one run using the above processes at a large-scale thin-film silicon solar cell production line, having a minimum initial dot-cell efficiency of about 10% ($V_{oc}$ of about 2.15 V, $J_{sc}$ of about 7.5 mA/cm$^2$, and an FF of about 62%), and a minimum yield of about 90%. The differential pumping chamber can be the DPIU 500 of FIG. 6.

Example 3

Figure 10:
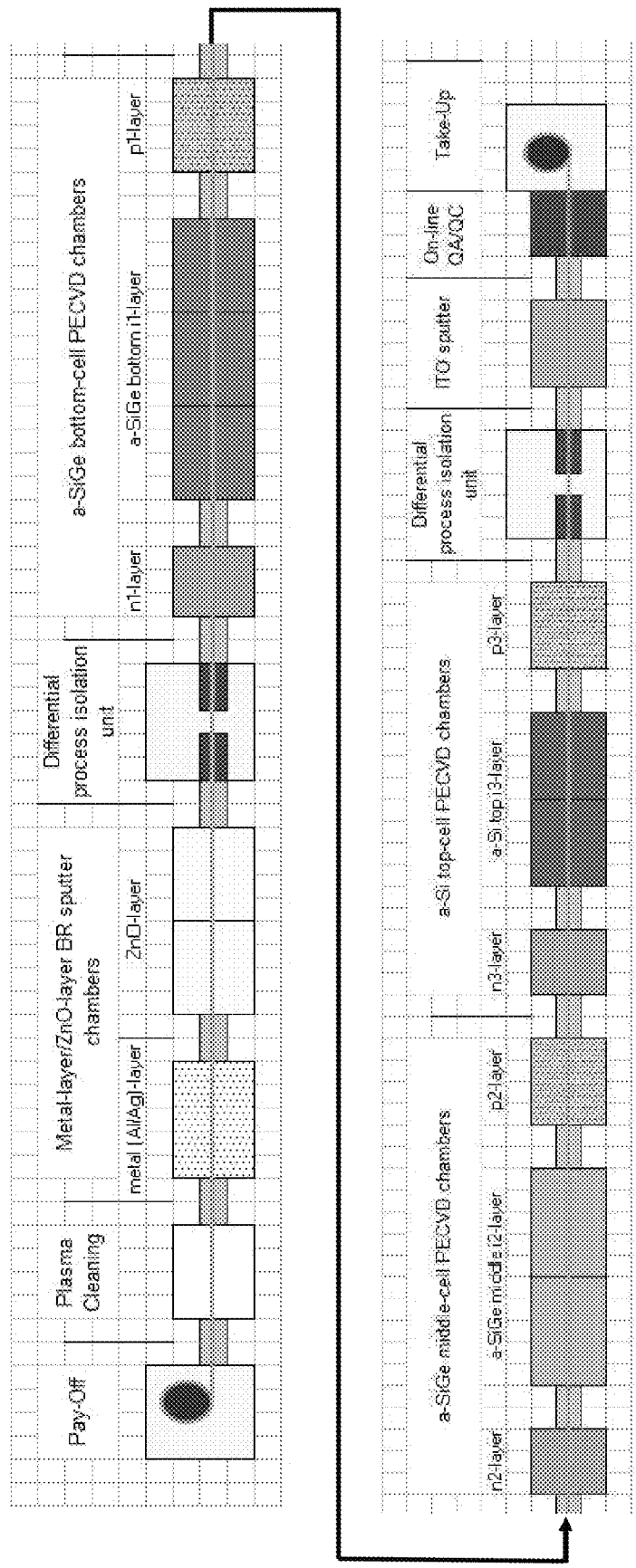
FIG. 10 is a cross-sectional side view of a plasma-cleaning/BR-sputter/silicon-PECVD/ITO-sputter roll-to-roll production machine (illustrated in two sections, top and bottom, joined by a connector line in order to fit on page), in accordance with an embodiment of the invention.

With reference to FIG. 10, a vacuum roll-to-roll thin-film production machine may be used to form the photovoltaic cell of FIG. 7. The roll-to-roll production machine, illustrated in two sections to fit on the page, may be a single, continuous, roll-to-roll system. A large-scale thin-film silicon solar cell roll-to-roll production machine in the front-end facility comprises a substrate payout chamber, a plasma cleaning chamber, a back-reflector sputtering deposition chamber, a thin-film silicon PECVD deposition chamber, a transparent conductor deposition chamber, and a substrate take up chamber. A differential process isolation unit (DPIU) is disposed between the back-reflector deposition chamber and the PECVD chamber. A second DPIU is disposed between the PECVD chamber and the transparent conductor deposition chamber. Stainless steel (SS) coils are used as substrates, which have a thickness of about 0.005" (0.127 mm), a minimum width of about 10", a preferable width of about 36", and a minimum length of about 5000 ft.

In the plasma cleaning chamber, an Ar or Ar/$O_2$-containing plasma at a pressure of about 0.01 Torr is used to clean the SS substrate.

Next, a metal-layer/ZnO-layer back-reflector (BR) is deposited at about 5 mTorr by Ar sputtering on the substrate. Metal (Al or Ag) and ZnO are deposited with minimum thicknesses of about 100 nm and about 300 nm, respectively. The flexible SS web coils coated with an Al (or Ag)/ZnO back-reflector moves through a differential process isolation unit (DPIU) into thin-film silicon PECVD deposition chambers operating at pressures between about 0.5 Torr and 5 Torr. The DPIU is fed with Ar sweep gas on the BR side and $H_2$ sweep gas on the PECVD side. Then, the thin-film silicon coated material web, which has a SS/BR/a-SiGe/a-SiGe/a-Si multi-layer structure, moves through a second DPIU to an ITO sputtering chamber for completing the deposition of an ITO transparent conductive layer on top, the ITO transparent conductive layer having a thickness of about 70 nm. The second DPIU is fed with $H_2$ sweep gas on the PECVD side and Ar sweep gas on the ITO side. Thus, large-area (minimum of about 3 feet×5000 feet) flexible thin-film silicon photovoltaic (or solar cell) materials can be produced in a single machine using the above processes at a large-scale thin-film silicon solar cell production line, having a minimum initial dot-cell efficiency of about 10% ($V_{oc}$ of about 2.15 V, $J_{sc}$ of about 7.5 mA/cm$^2$, and a fill factor (FF) of about 62%), and a minimum yield of about 90%. The DPIU can be the system 500 of FIG. 6.

Example 4

Figure 11:
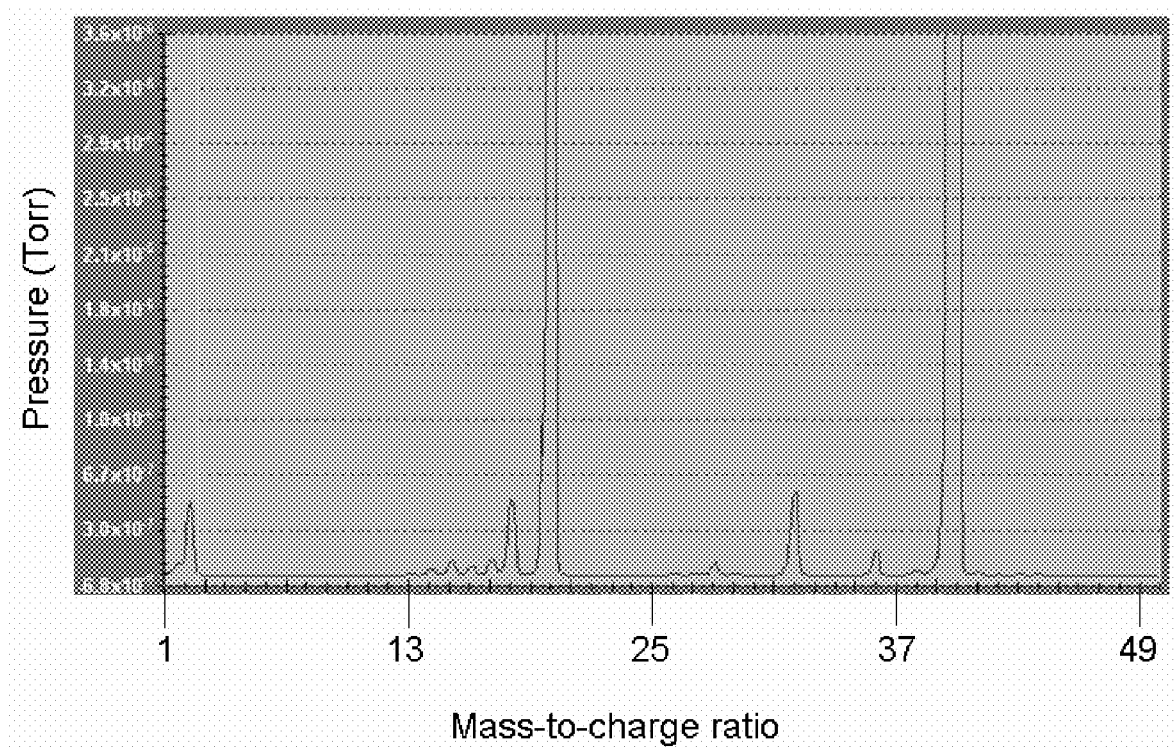
FIG. 11 is a residual gas analyzer (RGA) plot, in accordance with an embodiment of the invention.

A thin-film silicon PECVD chamber is filled with $H_2$ gas at a flow rate of about 12000 sccm and a pressure of about 1.0 Torr. An ITO sputtering chamber is filled with Ar gas at a flow rate of about 1000 sccm and $O_2$ gas at a flow rate of about 5 sccm. The PECVD chamber and the ITO sputtering chamber are adjacent a DPIU, such as the DPIU 500 of FIG. 6. A sweep gas flow 505 comprising $H_2$ gas at a flow rate of about 4000 sccm is admitted into the PIU 501. A sweep gas flow 506 comprising Ar gas at a flow rate of about 5000 sccm is admitted into PIU 502. The evacuation space 503 has a pressure of about 60 mTorr. The ITO sputtering chamber (e.g., chamber 508 of FIG. 6) has a pressure of about 4 mTorr. With reference to FIG. 11, residential (or residual) gas analyzer (RGA) peaks for $H_2$, $O_2$, Ar gases detected at the ITO sputtering gave an $H_2$/Ar ratio of about 0.42% and an $O_2$/Ar ratio of about 0.55%. A high-quality ITO film was produced on thin-film silicon in roll-to-roll mode based on above process parameters.

It should be understood from the foregoing that, while particular implementations have been illustrated and described, various modifications can be made thereto and are contemplated herein. It is also not intended that the invention be limited by the specific examples provided within the specification. While the invention has been described with reference to the aforementioned specification, the descriptions and illustrations of embodiments of the invention herein are not meant to be construed in a limiting sense. Furthermore, it shall be understood that all aspects of the invention are not limited to the specific depictions, configurations or relative proportions set forth herein which depend upon a variety of conditions and variables. Various modifications in form and detail of the embodiments of the invention will be apparent to a person skilled in the art. It is therefore contemplated that the invention shall also cover any such modifications, variations and equivalents.

What is claimed is:

1. A vacuum deposition apparatus, comprising:
   a substrate pay-out chamber and a substrate take-up chamber;
   a substrate support system extending from the substrate pay-out chamber to the substrate take-up chamber;
   a high-pressure vacuum deposition chamber;
   a low-pressure vacuum deposition chamber; and
   a differential process isolation unit (DPIU) disposed between the high-pressure vacuum deposition chamber and the low-pressure vacuum deposition chamber.

2. The vacuum deposition apparatus of claim 1, wherein the high-pressure vacuum deposition chamber is a semiconductor deposition chamber.

3. The vacuum deposition apparatus of claim 1, wherein the low-pressure vacuum deposition chamber is a transparent conductor deposition chamber.

4. The vacuum deposition apparatus of claim 1, wherein the high-pressure vacuum deposition chamber is configured to deposit thin film silicon or thin film silicon alloys.

5. The vacuum deposition apparatus of claim 1, wherein the low-pressure vacuum deposition chamber is configured to deposit indium tin oxide.

6. The vacuum deposition apparatus of claim 1, further comprising a real-time online measurement chamber.

7. The vacuum deposition apparatus of claim 6, wherein the real-time online measurement system is located between the low-pressure vacuum deposition chamber and the substrate take-up chamber.

8. The vacuum deposition apparatus of claim 6, wherein the real-time online measurement system comprises a current-voltage measurement system.

9. The vacuum deposition apparatus of claim 6, wherein the real-time online measurement system comprises a cell isolation system.

10. The vacuum deposition apparatus of claim 9, wherein the cell isolation system comprises a laser scriber.

11. The vacuum deposition apparatus of claim 6, wherein the high-pressure vacuum deposition chamber, the low-pressure vacuum deposition chamber, the DPIU and the real-time online measurement chamber are disposed between the substrate pay-out chamber and the substrate take-up chamber.

12. The vacuum deposition apparatus of claim 1, wherein the DPIU is configured to maintain a pressure differential between the high-pressure vacuum deposition chamber and the low-pressure vacuum deposition chamber.

13. The vacuum deposition apparatus of claim 1, further comprising a back-reflector deposition chamber.

14. The vacuum deposition apparatus of claim 1, further comprising a plasma cleaning chamber.

15. A system for forming a thin film over a substrate, comprising:
    a substrate pay-out chamber configured to provide the substrate;

a first reaction space configured to form a semiconductor thin film over the substrate;

a second reaction space configured to form a transparent conductor over the substrate;

a differential process isolation unit (DPIU) disposed between the first reaction space and the second reaction space, the DPIU configured to maintain a pressure differential between the first reaction space and the second reaction space;

a substrate take-up chamber for collecting the substrate; and a substrate support system configured to move the substrate from the substrate pay-out chamber to the first reaction space, from the first reaction space to the second reaction space, and from the second reaction space to the substrate take-up chamber.

16. The system of claim 15, wherein the first reaction space is configured to form the semiconductor thin film over the substrate via plasma-enhanced chemical vapor deposition.

17. The system of claim 15, further comprising a real-time online measurement chamber.

18. The system of claim 17, wherein the real-time online measurement chamber is disposed between the second reaction space and the substrate take-up chamber.

19. The system of claim 15, wherein the first reaction space is configured to deposit a thin film silicon or thin film silicon alloy over the substrate.

20. The system of claim 15, wherein the second reaction space is configured to deposit indium tin oxide over the substrate.

21. The system of claim 15, wherein the first reaction space is configured to form one of a p-doped or n-doped semiconductor thin film over the substrate.

22. The system of claim 21, further comprising a third reaction space between the first reaction space and the DPIU, the third reaction space configured to form an intrinsic semiconductor thin film over the substrate.

23. The system of claim 22, further comprising a fourth reaction space between the third reaction space and the DPIU, the fourth reaction space configured to form the other of the p-doped or n-doped semiconductor thin film over the substrate.

24. The system of claim 15, wherein the first reaction space has a first pressure (P1) and the second reaction space has a second pressure (P2), and the DPIU is configured to maintain a pressure differential (P1/P2) greater than or equal to about 10:1.

25. The system of claim 24, wherein the DPIU is configured to maintain a pressure differential (P1/P2) greater than or equal to about 100:1.

26. A differential process isolation unit, comprising:

an evacuation space; and at least two process isolation units in fluid communication with the evacuation space, each process isolation unit comprising:

a first port configured to permit movement of a substrate into the process isolation unit;

a second port configured to permit movement of a substrate out of the process isolation unit;

a first conduction space between the first port and the second port, the first conduction space disposed below a substrate;

a second conduction space between the first port and second port, the second conduction pace above the substrate;

a first restrictor disposed between the first conduction space and the first port; and a second restrictor disposed between the first conduction space and the second port.

* * * * *